(12) United States Patent
Ortner et al.

(10) Patent No.: US 11,891,326 B2
(45) Date of Patent: Feb. 6, 2024

(54) METHOD FOR PROCESSING GLASS BY ALKALINE ETCHING

(71) Applicant: SCHOTT AG, Mainz (DE)

(72) Inventors: Andreas Ortner, Gau-Algesheim (DE); Fabian Wagner, Mainz (DE); Markus Heiss-Chouquet, Bischofsheim (DE); Michael Drisch, Mainz (DE); Vanessa Glässer, Mainz (DE); Annika Hörberg, Mainz (DE); Marisa Boles-Rehbogen, Mainz (DE)

(73) Assignee: SCHOTT AG, Mainz (DE)

( * ) Notice: Subject to any disclaimer, the term of this patent is extended or adjusted under 35 U.S.C. 154(b) by 41 days.

(21) Appl. No.: 17/450,957

(22) Filed: Oct. 14, 2021

(65) Prior Publication Data
US 2022/0112123 A1   Apr. 14, 2022

(30) Foreign Application Priority Data

Oct. 14, 2020 (EP) .................................... 20201804

(51) Int. Cl.
| | |
|---|---|
| *C03C 15/00* | (2006.01) |
| *C03C 3/097* | (2006.01) |
| *C09K 13/02* | (2006.01) |
| *C03C 25/68* | (2006.01) |
| *B81C 1/00* | (2006.01) |
| *C03C 23/00* | (2006.01) |
| *C03C 3/087* | (2006.01) |
| *C03C 3/091* | (2006.01) |
| *C03C 3/093* | (2006.01) |

(52) U.S. Cl.
CPC .......... *C03C 15/00* (2013.01); *B81C 1/00539* (2013.01); *C03C 3/087* (2013.01); *C03C 3/091* (2013.01); *C03C 3/093* (2013.01); *C03C 3/097* (2013.01); *C03C 23/0025* (2013.01); *C03C 25/68* (2013.01); *C09K 13/02* (2013.01)

(58) Field of Classification Search
None
See application file for complete search history.

(56) References Cited

U.S. PATENT DOCUMENTS

| | | | |
|---|---|---|---|
| 2010/0068889 A1 | 3/2010 | Stockum | |
| 2017/0103249 A1* | 4/2017 | Jin | .......................... C03C 17/36 |
| 2018/0215647 A1 | 8/2018 | Ortner | |
| 2018/0342450 A1 | 11/2018 | Huang | |

FOREIGN PATENT DOCUMENTS

| | | | | |
|---|---|---|---|---|
| CN | 108117270 | * | 6/2018 | ............. C03C 15/00 |
| DE | 102013103370 | | 10/2014 | |
| DE | 102018100299 | | 8/2018 | |
| DE | 102018005218 | | 9/2019 | |

* cited by examiner

*Primary Examiner* — Jiong-Ping Lu
(74) *Attorney, Agent, or Firm* — Ruggiero McAllister & McMahon LLC

(57) ABSTRACT

A method for processing glass is provide. The method includes the steps of providing a glass element and removing glass material from the glass element by etching with an alkaline etching medium in an organic solvent.

23 Claims, 5 Drawing Sheets

METHOD FOR PROCESSING GLASS BY ALKALINE ETCHING

CROSS REFERENCE TO RELATED APPLICATIONS

This application claims benefit under 35 USC § 119 of European Application 20 201 804.0 filed on Oct. 14, 2020, the entire contents of which are incorporated herein by reference.

BACKGROUND

1. Field of the Invention

The present application relates generally to process glasses in form of fine structures or cutouts or to create an outer contour or to remove glass from a glass element with an initial thickness to a lower target thickness. In particular, the present application relates to a method for processing or structuring glass by etching and also the processed or structured glass element which can be produced thereby.

2. Description of Related Art

The precise structuring of transparent, opaque or non-transparent glasses or else glass ceramics is of great interest in many fields of applications. Accuracies in the range of a few micrometers are required here. The structuring relates to holes, cavities, channels in a round or angular from or of any freeform shapes. In order to be used in a wide field of application, the processing should leave behind no damage, residues or stresses in the marginal region or volume of the substrate.

DE 10 2018 005 218 A1 relates to a method for modifying a material, in which the focus of a laser beam is guided relative to a solid body in such a way that the path simultaneously has a movement component perpendicular thereto in addition to a two-dimensional movement component. In selective laser etching, the high intensity of the laser radiation leads to local crack-free modification in the irradiated material.

DE 10 2013 103 370 A1 describes a method for introducing perforations into a glass substrate. In that case, firstly an opening is produced in a glass substrate by means of laser radiation, whereupon material is subsequently removed by means of an etching method.

Further, DE 10 2018 100 299 A1 discloses a method wherein the glass element is exposed to an etching medium which removes glass of the glass element in a basic etching solution at a slow removal rate of less than 8 µm per hour and the filament-shaped flaw widens to form a channel and introduces rounded, substantially hemispherical depressions in the wall of the channel.

A disadvantage of known methods is that it is possible only with difficulty to produce filigree, complex structures in the volume of the glass or glass ceramic substrate with tenable outlay and high quality, for example with regard to the strength of the component. Furthermore, some glasses cannot be etched in water based etching mediums. At the same time, the process time of the method is also intended to be improved.

SUMMARY

The present application provides a nearly water-free alkaline etching which is fast and associated with lower costs for processing or structuring glass.

The present application provides a method for processing glass, wherein a glass element is provided and glass material is removed of the glass element, whereby the removal is carried out by etching and wherein an alkaline etching medium in an organic solvent is used.

In particular, the glass material is selectively or locally removed of the glass element or homogeneously isotropically removed over the entire surface of the glass element.

Furthermore, preferably no other additives are used. For the etching the organic solvent is present as a main component, in particular with more than 30 percent by weight (wt %).

Currently, the etching is done in water-based alkaline etching medium. But the boiling point in specific organic solvents is much higher than the one of water-based alkaline etching medium. Therefore, etching in an organic solvent can be at higher temperatures and therefore much faster. In addition, because the degradation products are dissolved differently some glasses which are hard to be structured in water-based etching medium can easier be structured in an organic solvent.

So, the etching medium is nearly water-free. With the water-free etching medium is meant that the water content of the etching medium is preferably less than 5 percent by weight (wt %), more preferably less than 1 percent by weight (wt %).

This is mainly due to ambient humidity which unfortunately cannot be completely prevented. Actually, the solution should be free of water. In the present anhydrous process, the different properties, such as the increased boiling point and the changed solubility, are used in contrast to aqueous etching.

Suitable to dissolve basic agents are particularly those organic compounds that have at least one hydroxyl group. Preferably, polyols, or, respectively, organic compounds with at least two hydroxyl groups are used.

The organic solvent preferably comprises an alcohol. The alcohol may in particular be a polyvalent alcohol, or, respectively a polyhydric alcohol to improve solubility of hydroxides. Particularly suited are diols or dialcohols, respectively, such as ethylene glycol. An example of a triol which is a suitable solvent or a component of a solvent is glycerol.

Further, the organic solvent may be a mixture of organic compounds, such as a mixture of polyvalent, i.e., polyhydric alcohols or a polyvalent alcohol with one or more other organic compounds.

Ethylene glycol has a boiling point of approximately 197° C. Thus, the maximum processing temperature is much more than in water-based etching media. Consequently, processing or structuring of other glasses is possible because due to insoluble degradation products, some glasses cannot be etched in water-based etching media, but can be processed in alcohol.

Further the maximum etching temperature in organic solvents is much higher than in water-based solvents, so the etching is preferred in a temperature of more than 130° C., with preference more than 150° C., particularly preferably more than 170° C. Therefore, the processing speed can be higher.

As alkaline etching medium sodium hydroxide (NaOH) or potassium hydroxide (KOH) is particular suitable. Here, for alkaline etching medium consideration is preferably given to KOH. KOH is especially well suited as etching medium for fine structuring.

KOH in the organic solvent, especially in ethylene glycol, has proven to be particularly preferred in a concentration of more than 4 mol/l, preferably more than 5 mol/l, particularly preferably more than 6 mol/l, but less than 30 mol/l.

An object of the present application is to provide a fast nearly water-free etching. So, if the glass element is exposed to the alkaline etching medium in an organic solvent at an etching temperature of more than 130° C. the glass material of the glass element is preferably removed at a removal rate or an etching rate of at least 10 μm per hour, preferably of more than or equal 20 μm per hour.

The glass element according to the present application is preferably a disc-shaped or plate-like thin glass with two opposite side surfaces. The glass element can have a thickness of less than 1500 micrometer (μm) or a thickness of 8 mm, 10 mm or 20 mm up to 100 mm. Consequently, the glasses are suitable for processing fine structures or cutouts or for creating an outer contour as well as for removing glass from a glass element with an initial thickness to a lower target thickness. Thin glasses and high temperatures accelerate the process and save or reduce time. The present application accordingly provides a glass element preferred being a borosilicate glass or a soda lime silicate glass that can be produced or procured from Schott AG, Mainz.

The present application furthermore encompasses a glass element preferably comprising one of the following glass compositions in percent by weight (wt-%):

| | |
|---|---|
| $SiO_2$ | 63-83, |
| $Al_2O_3$ | 0-7, |
| $B_2O_3$ | 5-18, |
| $Li_2O + Na_2O + K_2O$ | 4-14, |
| $MgO + CaO + SrO + BaO + ZnO$ | 0-10, |
| $TiO_2 + ZrO_2$ | 0-3, |
| $P_2O_5$ | 0-2; |

(an example of a glass with the above given composition is the glass D263 by Schott AG, Mainz;) or

| | |
|---|---|
| $SiO_2$ | 50-75, |
| $Al_2O_3$ | 7-25, |
| $B_2O_3$ | 0-20, |
| $Li_2O + Na_2O + K_2O$ | 0-0.1, |
| $MgO + CaO + SrO + BaO + ZnO$ | 5-25, |
| $TiO_2 + ZrO_2$ | 0-10, |
| $P_2O_5$ | 0-5; |

(an example of a glass with the above given composition is the glass AF32 by Schott AG, Mainz;) or

| | |
|---|---|
| $SiO_2$ | 75-85, |
| $B_2O_3$ | 8-18, |
| $Al_2O_3$ | 0.5-4.5 |
| $Na_2O$ | 1.5-5.5, |
| $K_2O$ | 0-2, |

(an example for this composition is the glass Boro33 by Schott AG, Mainz) or

| | |
|---|---|
| $SiO_2$ | 55-75, |
| $Na_2O$ | 0-15, |
| $K_2O$ | 2-14, |
| $Al_2O_3$ | 0-15, |
| $MgO$ | 0-4, |
| $CaO$ | 3-12, |
| $BaO$ | 0-15, |
| $ZnO$ | 0-5, |
| $TiO_2$ | 0-2; |

(an example of this composition is the glass B270 by Schott AG, Mainz).

In general, borosilicate glasses or soda lime silicate glasses having titanium content are particularly suitable for the processing or structuring in an alkaline etching medium in an organic solvent according to the present application. Titanium compounds are generally poorly soluble in water or, like titanium carbide and titanium dioxide, completely insoluble. In contrast to this, titanium compounds are generally highly soluble in organic solvents. Thus, glass elements with titanium compounds in organic solvents do not form undesirable solid precipitation products.

Further, silicate glasses having a low alkali metal content are particularly suitable for the processing or structuring according to the present application. Excessively high alkaline metal contents can make etching more difficult. This makes the glasses particularly suitable for controlled etching using alkaline etching mediums. In accordance with one development of the present application, provision is therefore made for the glass of the glass element to be a silicate glass having a content of alkaline metal oxides of less than 17 percent by weight.

The method according to the present application can provide a glass element which is pre-damaged with a laser beam of an ultrashort pulse laser by introducing flaws and wherein the flaws are expanded by the alkaline etching medium. The term "flaw" is understood hereinafter to mean a material modification, a crack or a very fine channel, which may or may not pass through the substrate.

The glass element can be pre-damaged with a laser beam by introducing filament-shaped flaws and wherein the filament-shaped flaws are expanded by the alkaline etching medium to form channels.

The filament-shaped flaw can be a continuous thin, open channel. However, it is also possible that there is only a filament-shaped or linear change in the material. Mixed forms are also possible, in which cavities or material changes extend along a line. One form, for example, are short damages lined up in a chain along a line, which are caused by periodic self-focusing of an intensive laser beam.

According to the present application, a filament-shaped flaw is produced by means of laser beams of an ultrashort pulse laser. The filament-shaped flaw is then preferably expanded or widened by means of a selective etching process by the alkaline etching medium in an organic solvent to form a channel.

A suitable laser for this purpose is a Nd:YAG laser, e.g., radiating at a wavelength of 1064 nanometers. According to one embodiment, the ultrashort pulse laser is operated with a repetition rate within a range from 10 kHz to 400 kHz, preferably within a range from 30 kHz to 200 kHz. The repetition rate and the scan speed of the laser beam over the glass element may be selected so that the lateral distance of adjacent flaws (i.e., the pitch) is adjustable. The pulse duration is less than 100 picoseconds, preferably less than 20 ps. A suitable average power of the laser is within a range from 50 W to 500 W.

A further suitable laser for this purpose is a Yb:YAG laser, e.g., radiating at a wavelength of 1030 nanometers or 513 nanometers. According to this embodiment, the ultrashort pulse laser is operated with a repetition rate within a range from 10 Hz to 50 MHz, preferably within a range from 20 Hz to 40 MHz. The pulse duration is less than 20 picoseconds, preferably less than 10 ps down to 0.5 ps. A suitable average power of the laser is within a range from 20 W to 500 W.

Further embodiments with lasers working in the wavelength range between 1100 nm down to 100 nm (UV) and pulse durations between 100 ps and 200 fs are possible.

The method according to the present application in particular comprises the steps that the diameter of the channels which are located next to one another along a prescribed path is increased by the alkaline etching medium until the glass between the channels is removed and the channels join and the glass element is thereby separated along the path. Using this method, both the outer contour of the glass element and outcuts can be formed. As by way of any wet chemical etching process, the edges of the glass element can be slightly joined.

According to the present application, then, it is even possible to widen by means of an etching medium filament-shaped flaws that have a diameter of at most 1 μm, preferably of at most 0.8 μm and particularly preferably of at most 0.5 μm. Due to the widening, channels are formed in the glass element.

In a particular embodiment of the process the prescribed path of the channels forms a closed, for example circular or rectangular path so that the separation along the path by the alkaline etching medium leads to an opening in the glass element. Said opening is open towards a side of the substrate, that is to say to a side surface, and accordingly defines a cutout on the surface of the substrate. It can assume different geometric shapes or else more complex structures.

The glass composition, the composition of the alkaline etching medium, the removal or etching rate and the etching temperature may be adjusted so that a predetermined angle of taper is formed at one edge or wall of the channel relative to the respective side face. However, it is possible to produce channels or edges with a small or vanishing taper angle, which means that the angle between the side faces and the wall of the channel or edge is 90° or at least very close to 90°.

The present application will be illustrated in more detail on the basis of preferred embodiments and with reference to the accompanying figures. In the figures, identical reference numerals in each case denote identical or corresponding elements.

DETAILED DESCRIPTION

Figure 1:
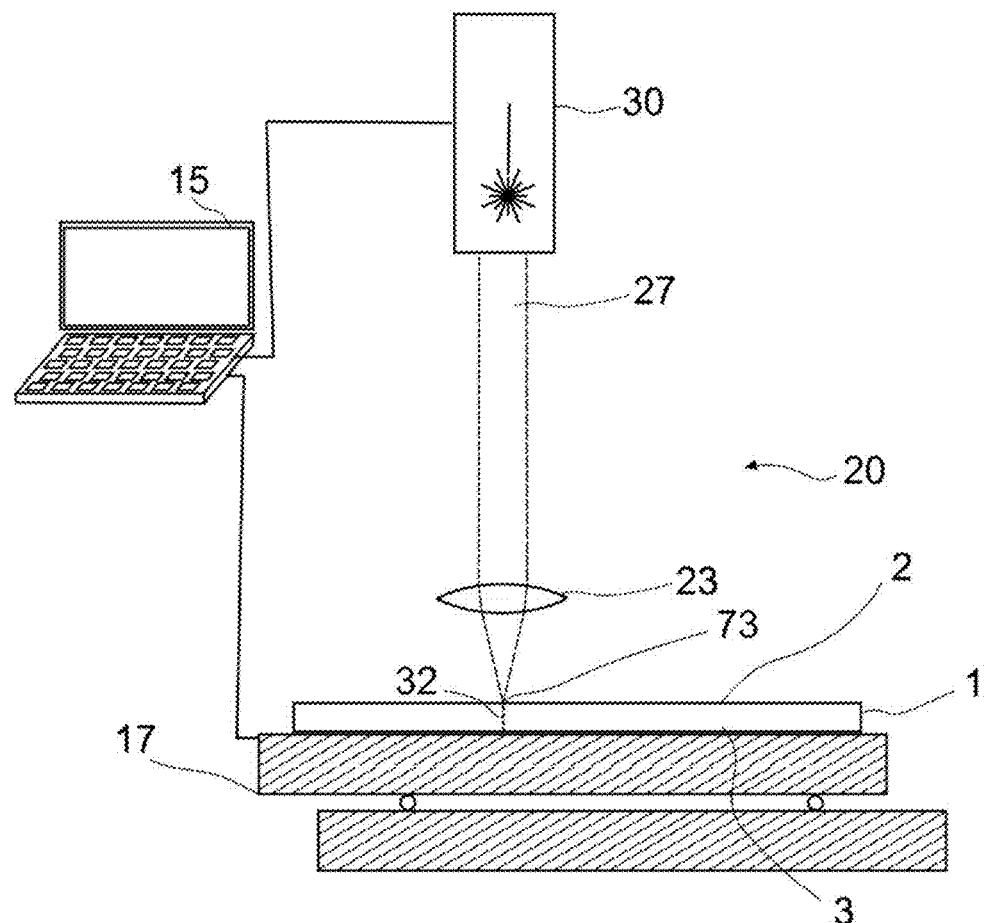
FIG. 1 shows an apparatus for laser processing of the glass elements as preparation for subsequent etching.

FIG. 1 shows a working example of a laser processing apparatus 20, by means of which filament-shaped flaws 32 can be introduced into a glass element 1 in order to introduce channels 5 at the positions of the filament-shaped flaws 32 in a subsequent etching process. The apparatus 20 comprises an ultrashort pulse laser 30 having preceding focusing optics 23 and a positioning device 17. The positioning device 17 enables the point of impingement 73 of the laser beam 27 of the ultrashort pulse laser 30 to be positioned laterally on one side face 2 of a plate-like glass element 1 to be worked. In the example depicted, the positioning device 17 comprises an x-y table on which another side face 3 of the glass element 1 rests. However, as an alternative or in addition, it is also possible to make the optics mobile in order to move the laser beam 27 so that the point of impingement 73 of the laser beam 27 can be moved with the glass element 1 remaining fixed. The focusing optics 23 then focuses the laser beam 27 to form a focus which is elongated in the direction of the beam, i.e., accordingly transverse, in particular perpendicular, to the irradiated side face 2. Such a focus can, for example, be produced by means of a conical lens (known as an axicon) or a lens having great spherical aberration. The control of the positioning device 17 and of the ultrashort pulse laser 30 is preferably executed by means of a programmed computer 15. In this way, predetermined patterns of filament-shaped flaws 32 distributed laterally along the side face 2 can be produced, in particular by input of positional data, preferably from a file or via a network.

According to one working example, the following parameters can be used for the laser beam 27: The wavelength of the laser beam is 1064 nm, typical for a Nd:YAG laser. A laser beam 27 having an initial beam diameter of 12 mm is produced, and this is then focused by means of optics in the form of a biconvex lens having a focal length of 16 mm. The pulse duration of the ultrashort pulse laser is less than 20 ps, preferably about 10 ps. The pulses are emitted in bursts of 2 or more, preferably 4 or more pulses. The burst frequency is 12-48 ns, preferably about 20 ns, the pulse energy is at least 200 microjoule and the burst energy is accordingly at least 400 microjoule.

Subsequently, after introduction of one or in particular more than one filament-shaped flaw(s) 32, the glass element 1 is taken out and placed in an alkaline etching medium where, in an etching process, glass is removed along the filament-shaped flaws 32 so that a channel 5 is introduced into the glass element 1 at the position of such a flaw 32.

For the etching an alkaline etching medium in an organic solvent is used.

Preference is given as alkaline etching bath to a KOH solution in an organic solvent, preferably ethylene glycol, having a concentration of KOH of more than 4 mol/l, preferably more than 5 mol/l, particularly preferably more than 6 mol/l, but less than 30 mol/l. Etching is, in one embodiment of the present application, carried out at a temperature of more than 130° C., preferably more than 150° C., particularly preferably more than 170° C.

Figure 2:
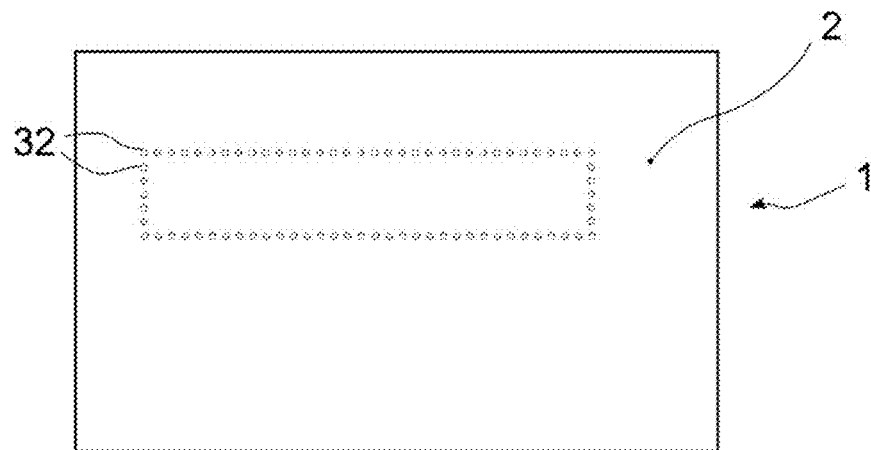
FIG. 2 shows a glass element with introduced filament-shaped flaws in a plan view.

FIG. 2 shows in a plan view onto the side face 2, a glass element 1 having a plurality of filament-shaped flaws 32 which are arranged in a particular pattern as can be inscribed in the glass element 1 by the above-described computer-controlled actuation of the positioning device 17 and the ultrashort pulse laser 30. In particular, the filament-shaped flaws 32 have here been introduced, by way of example, along a prescribed path in the form of a closed rectangular path or line into the glass element 1. The corners of the line can also be slightly rounded. A person skilled in the art will be able to see that not only rectangular paths but also paths or lines of any shape can be produced by means of the process.

Figure 3:
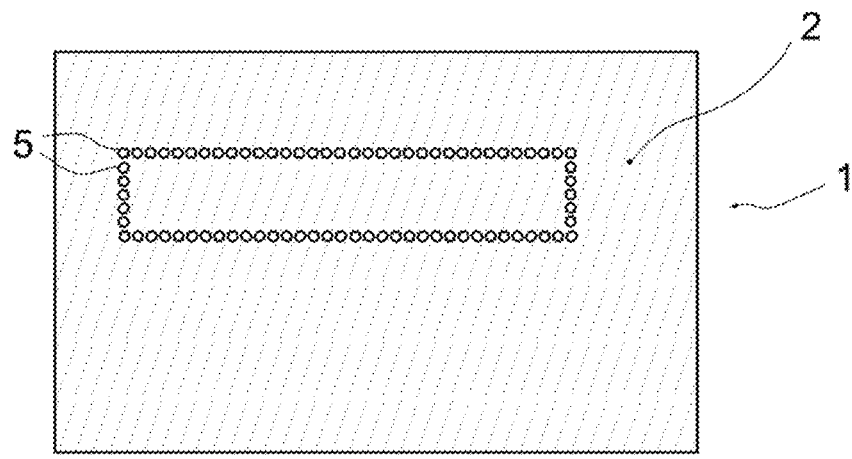
FIG. 3 shows the glass element with channels introduced along the filament-shaped flaws.

FIG. 3 shows the glass element 1 after a subsequent etching step, wherein the filament-shaped flaws are expanded by the alkaline etching medium and form channels 5 which are arranged next to one another along a prescribed path and form a row along the path. The diameter of the channels 5 is increased by the alkaline etching medium until the glass between the channels 5 is removed and the channels 5 can join and the glass element 1 can separated along the path. For example, the prescribed path of the channels 5 according to FIG. 3 forms a closed rectangular path so that the separation along the path by the alkaline etching medium can lead to an opening in the glass element 1. As a matter of course, the prescribed path can have another shape like a circular or ring form path, too.

Figure 4:
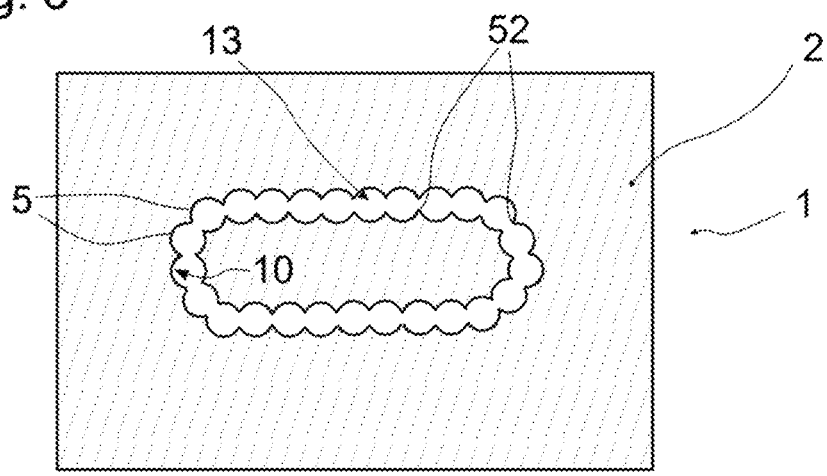
FIG. 4 shows a glass element in which the channels have increased and joined at the sides as a result of etching.

A glass element 1 in which the channels 5 have joined at the sides as a result of etching is shown in FIG. 4. This embodiment of the present application is based on the diameter of the channels 5 being increased by etching to such an extent that the glass between the channels 5 is removed and the channels 5 join.

Figure 5:
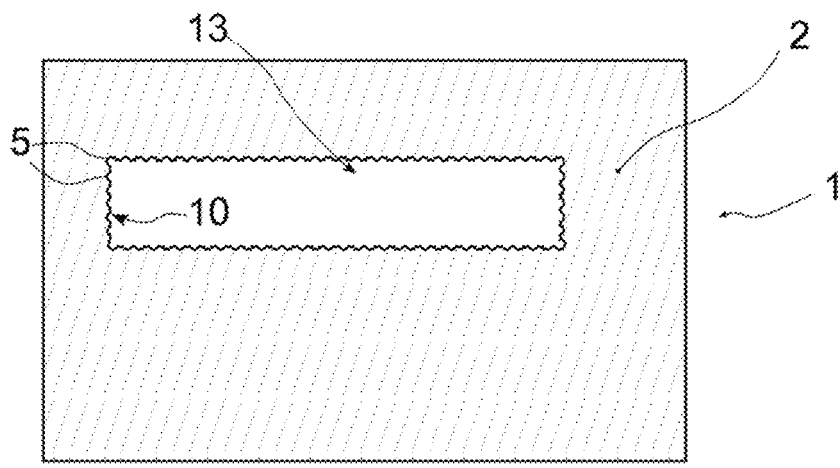
FIG. 5 shows the glass element after a part has been separated off.

FIG. 5 shows the glass element 1 after parting along the path. Since the channels 5 were arranged along a rectangular, closed parting line, an inner part is detached and an opening 13 is created in the glass element 1. The glass element 1 is shown as a hatched area the surrounding glass element 1 in order to distinguish the element from the opening 13, e.g., the channels 5 in the drawing, respectively the inner part.

FIG. 2 to FIG. 5 are examples of an embodiment of the process of the present application in which the point of impingement 73 of the laser beam 27 on the glass element 1 is conveyed along a prescribed path and a plurality of filament-shaped flaws 32 located next to one another on the path are introduced into the glass element 1 and the filament-shaped flaws 32 are expanded by the alkaline etching medium in an organic solvent to form channels 5 and wherein the diameter of the channels 5 which are located next to one another along a prescribed path is increased by the alkaline etching medium until the glass between the channels 5 is removed and the channels 5 join and the glass element 1 can be separated along the path.

The channels 5 can generally have a tubular cylindrical basic shape, or are tubular with a cylindrical wall. Here, a slight taper from the opening 13 at the side face 2 to the middle of the glass element 1 can be present. When the generally cylindrical channels 5 are joined in the course of widening during the etching operation, ridges 52 are formed at the abutting positions. In general, without being restricted to the example of FIG. 4, one embodiment of the present application provides for the channels 5 to adjoin one another so as to form ridges 52 which are located between the channels 5 and run parallel to the longitudinal direction of the channels 5. These ridges 52 or ribs accordingly run parallel to the longitudinal direction of the channels 5 and can therefore be seen only as serrations or tooth-like elements at the position of the transition region between neighbouring channels 5 in the depiction of FIG. 4. However, if the etching is continued, the ridges are flattened and may no longer be visible.

The glass composition, the composition of the alkaline etching medium, the removal or etching rate and the etching temperature are preferably adjusted so that a predetermined angle of taper is formed at one edge 10 or wall of the channel 5 relative to the respective side face 2, 3.

At higher removal rates in a range of at least 10 µm per hour, approximately 15 µm per hour to preferably of equal or more than 20 µm per hour, a rather perpendicular formation of the cavity remains, thus resulting in a taper angle in a range of 90°+/−5°, preferably 90°+/−3° and particularly preferably 90°+/−1.

An object of the present application is to provide a fast nearly water-free etching. So, if the glass element is exposed to the alkaline etching medium in an organic solvent at an etching temperature of more than 130° C. the glass material of the glass element is preferably removed at a removal rate or an etching rate of at least 10 µm per hour, preferably of more than or equal 20 µm per hour.

Because many organic solvents like alcohol, in particular ethylene glycol can have a higher boiling point than a water-based alkaline etching medium, the etching in an organic solvent can be operated at higher temperatures and therefore much faster.

Figure 6:
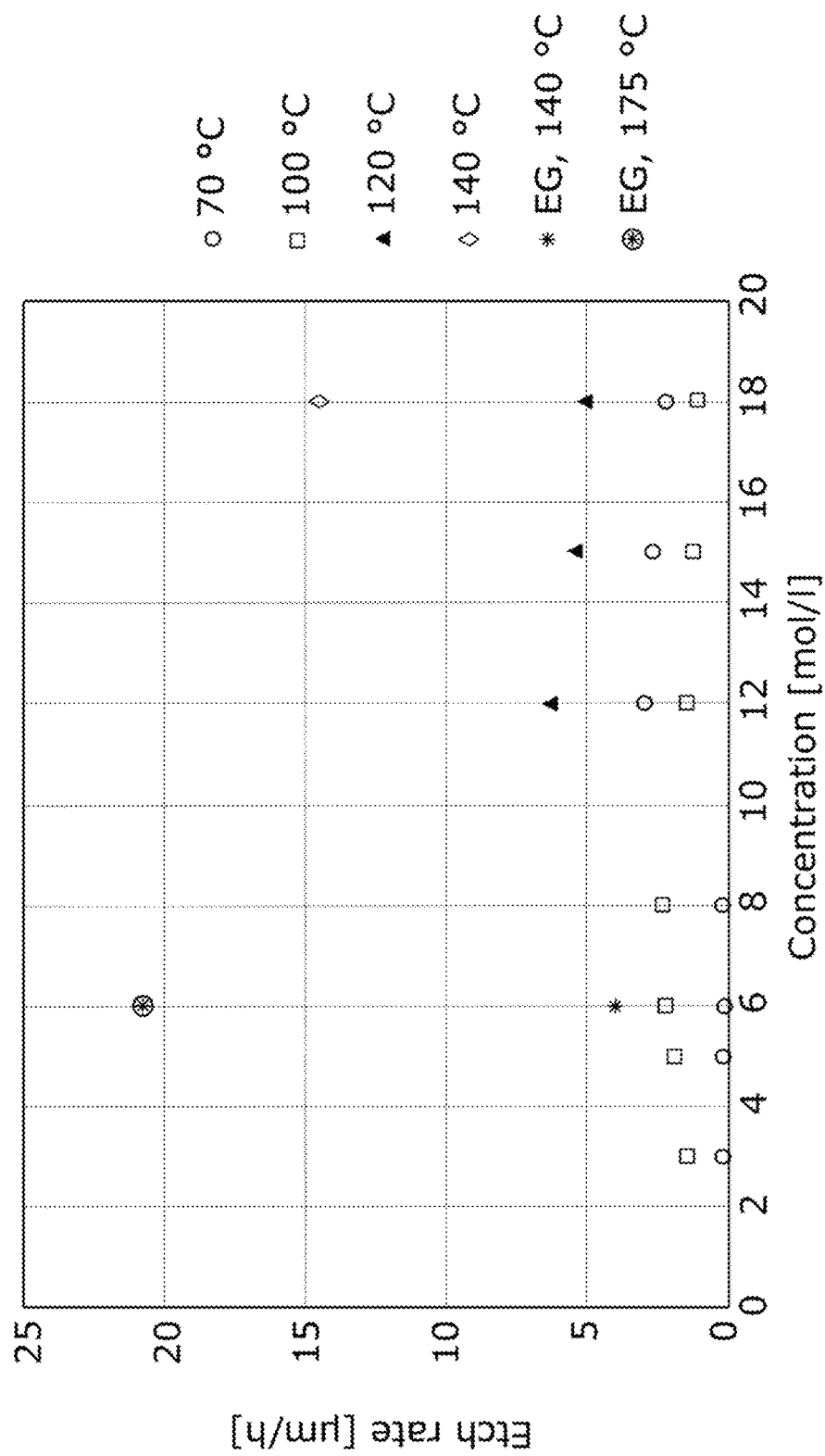
FIG. 6 shows a graph of the etching rates of Boro33 glass in KOH in water and alternatively in ethylene glycol at different temperatures as a function of the KOH concentration.

FIG. 6 shows measured values of the etching rates of the borosilicate glass under the designation Boro33 from Schott AG with the composition as given above, with a thickness of 1300 µm by different KOH concentrations in water at various temperatures. These measurements at 70° C., 100° C., 120° C. and 140° C. are compared to etching rates of a 6 mol/l KOH solution in ethylene glycol at 140° C. and 175° C.

The boiling point of 6 mol/l KOH in water is about 115° C., the boiling point of 15 mol/l KOH in water is about 140° C. and the boiling point of 6 mol/l KOH in ethylene glycol is about 195° C. Accordingly, the etching temperature is limited to the boiling point of the solvent.

FIG. 6 shows that for a concentration of 6 mol/l KOH in ethylene glycol at 140° C. an etching rate of 4 µm per hour is achieved. This etching rate is higher than for all water based etching solutions having the same molarity of KOH. However, with a concentration of 6 mol/l KOH in ethylene glycol and a temperature of 175° C., an etching rate of even 21 µm per hour is measured. This etching rate is an order of magnitude higher than that achievable with KOH in water. Further, for borosilicate glass D263 from Schott AG, Mainz with the composition as given above, at 175° C. an etching rate of almost 14 µm using 6 mol/l KOH in ethylene glycol was achieved.

In comparison, for the concentration of 6 mol/l KOH in water at around 100° C. it is measured an etching rate of less than 4 µm per hour and for the concentration of 15 mol/l KOH in water at around 120° C. it is measured an etching rate of less than 10 µm per hour. The etching rate of 6 mol/l KOH in ethylene glycol even far surpasses etching rates of water-based KOH solutions at high temperature and with a high molarity of KOH, as evident for the measured etching rate fora 18 mol/l solution at 140° C.

The degradation products from the etching often have very different solubilities in water. Some glasses are hard to be structured in water-based etching medium, as constituents with low solubility may precipitate. However, it has been shown that these glasses can often easier be etched and structured in an organic solvent. Specifically, borosilicate glasses or soda lime silicate glasses containing titanium are particularly suitable for the processing or structuring in an alkaline etching medium with an organic solvent according to the present application. Thus, glass elements with titanium compounds in organic solvents do not form undesirable solid precipitation products. So, glass elements, which comprise titanium, can positively influence the process time.

Figure 7:
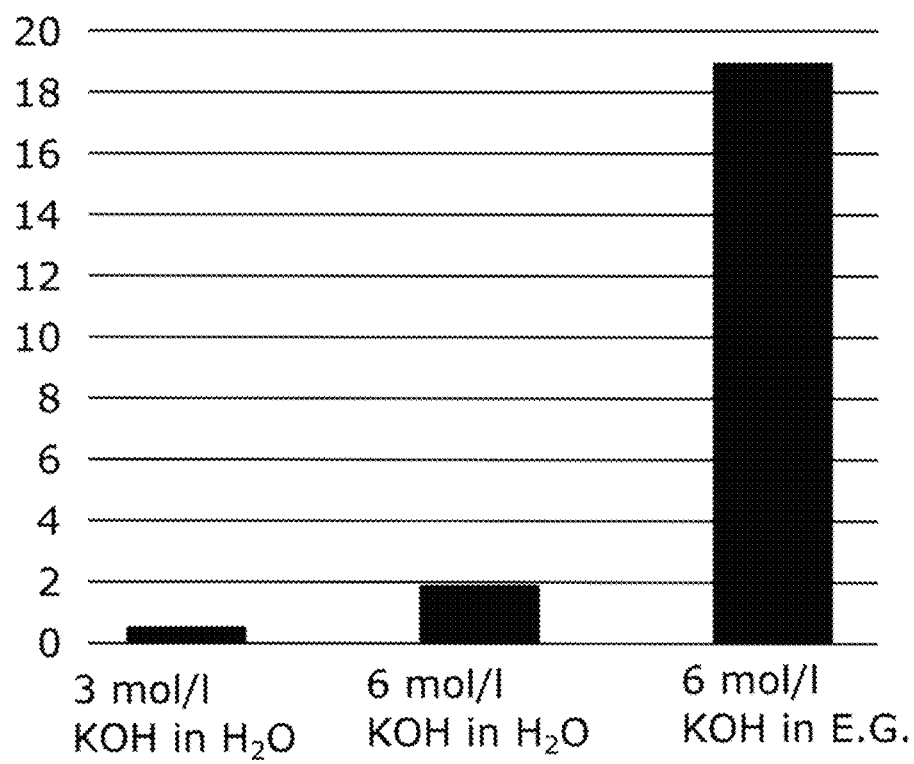
FIG. 7 shows the solubility of titanium in various etching media.

Examples for titanium solubilities are shown in the column chart of FIG. 7. Specifically, the solubility in etching solutions of 3 mol/l KOH in water (left column) and 6 mol/l KOH in water (center column) are compared with an etching solution of 6 mol/l KOH in ethylene glycol. As can be seen from the column chart, the solubility in the organic solution is almost ten times higher than in the comparable water-based solution with 6 mol/l KOH and more than 20 times higher than the 3 mol/l KOH in $H_2O$ solution.

The disclosure is not restricted to ethylene glycol as solvent as it is used for the exemplary embodiments discussed with reference to the figures. For example, other polyvalent organic compounds, preferably with high boiling points may be employed as well. Various organic compounds may be mixed to tailor the properties of the etching solution. Further, the solution may also comprise more than one basic constituent. For example, a combination of KOH and NaOH may be used.

Figure 8:
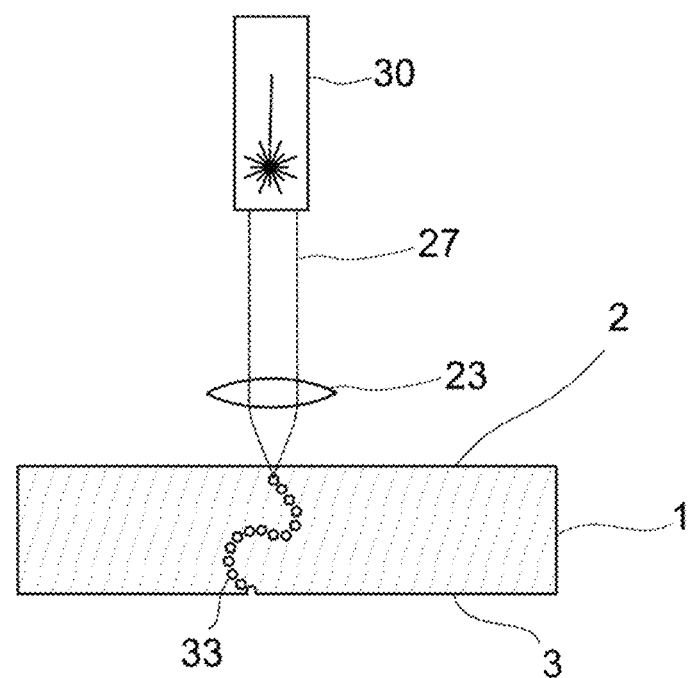
FIG. 8 shows a variant of the apparatus of FIG. 1 for introducing a series of flaws or defects inside the glass element.

FIG. 8 shows a variant of the apparatus of FIG. 1 for introducing a series of localized or spot shaped flaws 33 inside the glass element 1. For example, no straight elongated filament line is produced, but an extremely small focal point is moved along any path through the material and a small modification is created at each focal point, so that the movement of the focus through the material creates a modification curve that touches the surface at some point. Subsequently, the modification structure is selectively etched, thus creating a 3D structure in the material. So, the focusing optics 23 of the laser beam 27 of the ultrashort pulse laser 30 can be guided by a scanning movement on one side face 2 into the body of the glass element 1. To modify the material, a path of the localized or spot flaws 33 is written into the body of the glass element 1 with the laser beam 27, whereby the focus of the laser beam 27 can be guided relative to the body in such a way that the path has a two-dimensional movement component as well as a movement component perpendicular to it. By such a laser-induced modification, the etching rate can be abbreviated in the subsequent wet-chemical process. Due to the nearly water-free selectively alkaline etching a 3D structure or 3D objects from the bulk in form of undercuts or curves can be produced in this way.

Figure 9:
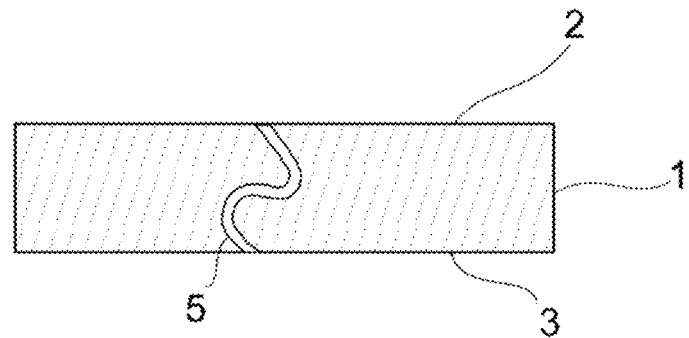
FIG. 9 shows the glass element processed with the apparatus of FIG. 8 after subsequent etching.

FIG. 9 shows the glass element 1 processed with the apparatus of FIG. 8 after subsequent etching, whereby the former localized or spot shaped flaws 33 inside the glass element 1 are expanded by the alkaline etching medium 4, for example, to form channels 5.

Figure 10:
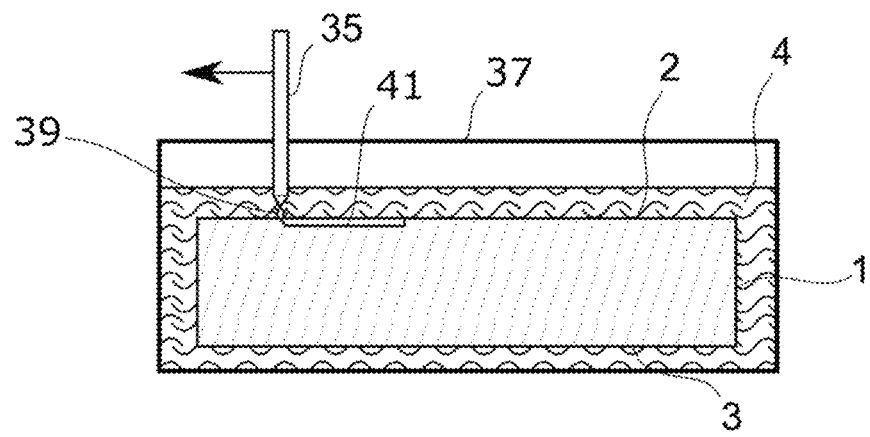
FIG. 10 shows an embodiment of an apparatus for locally etching the glass element.

FIG. 10 shows an embodiment of an apparatus for locally etching the glass element 1. In a container 37 filled with the alkaline etching medium 4 an electrode 35 is dipped to generate a stationary electrostatic discharge in form of a spark 39 to produce a recess 41 in the side face 2 of the glass element 1. Of course, another local heating element can be used instead of the electrode 35 for locally etching the glass element 1 in the nearly water-free alkaline etching medium 4. So, the precise chemical etching of the above-mentioned glass compositions is accelerated by a thermal process. And no intermediate or post processes are necessary. Micro-holes with a depth of millimeters can be drilled in a few seconds and channels of several hundred microns deep can be produced without difficulty. It is also possible to remove glass over a thickness of a few millimeters.

LIST OF REFERENCE NUMERALS

Glass element 1
Side faces 2, 3
Alkaline etching medium 4
Channel 5
Edge 10
Opening 13
Computer 15
Positioning device 17
Apparatus for laser processing 20
Focusing optics 23
Laser beam 27
Ultrashort pulse laser 30
Filament-shaped flaw 32
Localized or spot shaped flaw 33
Electrode 35
Container 37
Spark 39
Recess 41
Ridge 52
Point of impingement 73

What is claimed is:

1. A method for processing glass, comprising:
providing a glass element; and
removing glass material from the glass element, wherein the removing step comprises:
introducing flaws into the glass element along a prescribed path with a laser beam of an ultrashort pulse laser; and
expanding the flaws in the glass element by etching with an alkaline etching medium in an organic solvent until the flaws connect,
wherein the alkaline etching medium has a water content of less than 5 percent by weight (wt-%) and the organic solvent comprises an alcohol.

2. The method of claim 1, wherein the removing step comprises selectively or locally removing the glass material from one or more portions of the glass element.

3. The method of claim 1, wherein the removing step comprises homogeneously isotropically removing the glass material over an entire surface of the glass element.

4. The method of claim 1, wherein the alcohol comprises a material selected from a group consisting of polyvalent alcohol, polyhydric alcohol, diol (dialcohol), and ethylene glycol.

5. The method of claim 1, wherein the organic solvent is a mixture of organic compounds.

6. The method of claim 5, wherein the mixture of organic compounds is a mixture of polyvalent alcohols.

7. The method of claim 1, wherein the alkaline etching medium is potassium hydroxide (KOH) or sodium hydroxide (NaOH).

8. The method of claim 7, wherein the organic solvent comprises KOH in a concentration of more than 4 mol/l and less than 30 mol/l.

9. The method of claim 1, wherein the removing step is carried out in a temperature of more than 130° C.

10. The method of claim 1, wherein the providing step comprises providing the glass element with a feature selected from a group consisting of: a disc-shaped with a thickness of less than 1500 μm; plate-like shape with a thickness of less than 1500 μm; and a thickness up to 100 mm.

11. The method of claim 1, wherein the removing step comprises removes the glass material at a removal or etching rate of at least 10 μm per hour.

12. The method of claim 1, wherein the glass element is made of a material selected from a group consisting of: borosilicate glass; soda lime silicate glass; and a glass comprising titanium.

13. The method of claim 1, wherein the glass element comprises a glass composition in percent by weight:

| | |
|---|---|
| $SiO_2$ | 63-83, |
| $Al_2O_3$ | 0-7, |
| $B_2O_3$ | 5-18, |
| $Li_2O + Na_2O + K_2O$ | 4-14, |
| $MgO + CaO + SrO + BaO + ZnO$ | 0-10, |
| $TiO_2 + ZrO_2$ | 0-3, and |
| $P_2O_5$ | 0-2. |

14. The method of claim 1, wherein the glass element comprises a glass composition in percent by weight:

| | |
|---|---|
| $SiO_2$ | 50-75, |
| $Al_2O_3$ | 7-25, |
| $B_2O_3$ | 0-20, |
| $Li_2O + Na_2O + K_2O$ | 0-0, 1, |
| $MgO + CaO + SrO + BaO + ZnO$ | 5-25, |
| $TiO_2 + ZrO_2$ | 0-10, and |
| $P_2O_5$ | 0-5. |

15. The method of claim 1, wherein the glass element comprises a glass composition in percent by weight:

| | |
|---|---|
| $SiO_2$ | 75-85, |
| $B_2O_3$ | 8-18, |
| $Al_2O_3$ | 0.5-4.5, |
| $Na_2O$ | 1.5-5.5, and |
| $K_2O$ | 0-2. |

16. The method of claim 1, wherein the glass element comprises a glass composition in percent by weight:

| | |
|---|---|
| $SiO_2$ | 55-75, |
| $Na_2O$ | 0-15, |
| $K_2O$ | 2-14, |
| $Al_2O_3$ | 0-15, |
| $MgO$ | 0-4, |
| $CaO$ | 3-12, |
| $BaO$ | 0-15, |
| $ZnO$ | 0-5, and |
| $TiO_2$ | 0-2. |

17. The method of claim 1, wherein the flaws are filament-shaped flaws and wherein the expanding step expands the filament-shaped flaws to form channels.

18. The method of claim 1, wherein the expanding step further comprises expanding the flaws until the glass material between the flaws is removed such that the glass element is separated along the prescribed path.

19. The method of claim 18, wherein the prescribed path is a closed path so that the separation along the closed path defines an opening in the glass element.

20. The method of claim 1, wherein the expanding step further comprises adjusting a parameter selected from a group consisting of a composition of the glass material, a composition of the alkaline etching medium, an etching rate, an etching temperature, and any combinations thereof such that the flaws have a tapered edge.

21. A method for processing glass, comprising:
providing a glass element;
introducing flaws into the glass element along a prescribed path with a laser beam of an ultrashort pulse laser; and
expanding the flaws in the glass element by etching with an alkaline etching medium in an organic solvent, wherein the alkaline etching medium has a water content of less than 5 percent by weight (wt-%) and the organic solvent comprises a mixture of polyvalent alcohols.

22. The method of claim 21, wherein the etching medium contains water mainly due to ambient humidity.

23. A method for processing glass, comprising:
providing a glass element;
introducing flaws into the glass element along a prescribed path with a laser beam of an ultrashort pulse laser; and
expanding the flaws in the glass element by etching with an alkaline etching medium in an organic solvent at a temperature of more than 170° C., wherein the alkaline etching medium has a water content of less than 5 percent by weight (wt-%), wherein the etching medium contains water mainly due to ambient humidity.

* * * * *